United States Patent [19]
Peng

[11] Patent Number: 5,524,114
[45] Date of Patent: Jun. 4, 1996

[54] METHOD AND APPARATUS FOR TESTING SEMICONDUCTOR DEVICES AT SPEED

[75] Inventor: Stony F. Peng, Fremont, Calif.

[73] Assignee: LSI Logic Corporation, Milpitas, Calif.

[21] Appl. No.: 141,843

[22] Filed: Oct. 22, 1993

[51] Int. Cl.⁶ .................................................. G01R 31/26
[52] U.S. Cl. ...................... 371/22.1; 371/22.3; 371/22.4; 371/22.5; 375/327
[58] Field of Search ............................... 371/22.1, 22.3, 371/22.5, 22.4; 375/120, 354, 111–113; 327/114; 369/59; 364/487

[56] References Cited

U.S. PATENT DOCUMENTS

| | | | |
|---|---|---|---|
| 3,582,633 | 6/1971 | Webb | 371/25.1 |
| 4,806,879 | 2/1989 | Troxel | 331/2 |
| 4,876,702 | 10/1989 | Lesko | 375/120 OR |

*Primary Examiner*—Emanuel T. Voeltz
*Assistant Examiner*—Kamini S. Shah
*Attorney, Agent, or Firm*—Katz & Cotton

[57] ABSTRACT

A method and apparatus for testing semiconductor devices at device operating speed for both proper combinational and timing logic functions with a standard low speed logic tester. A high speed phase-lock-loop system clock of the semiconductor device is frequency and phase locked to the lower speed logic tester clock. Test data is shifted into the semiconductor device at the test clock speed. Two controlled system clock pulses are utilized to clock the test data into the semiconductor devices. The first of these two pulses starts the test and the second ends the test. In this way, the combinational functions of the semiconductor devices are tested at the system operating speed.

10 Claims, 3 Drawing Sheets

METHOD AND APPARATUS FOR TESTING SEMICONDUCTOR DEVICES AT SPEED

BACKGROUND OF THE INVENTION

1. Field of the Invention

The present invention relates to semiconductor devices and, more particularly, to a method and apparatus for testing semiconductor devices at their operating speed.

2. Description of the Related Technology

Semiconductor integrated circuits are produced by manufacturing a wafer (a disk of silicon) having many copies, each copy called a "die" (plural "dice"), of the integrated circuit. Typically, not all the dice of a wafer work properly. Thus, the first thing that must be done after the wafer is processed is to determine which dice are good. Each die on the wafer must be tested to determine whether it functions correctly. This testing activity is called "wafer sort". Only the dice that pass wafer sort testing are packaged.

During testing, parameters such as propagation delay and drive currents are checked, a process called "parametric testing". Whether or not the die carries out the function it was designed for is also checked by a process called "functional testing". The cost of doing functional testing is increasing rapidly. This is due to the fact that the ratio between the number of semiconductor devices on a die to the number of connection pads or I/O pins is rising. In fact, functional testing may be the most expensive part of manufacturing an integrated circuit.

Automatic test equipment that functionally tests semiconductor dice has become very expensive. In addition, the computing time required to calculate input test patterns to be applied to the die during these tests is extremely costly. What the integrated circuit manufacturers have done to reduce functional testing costs is to include circuitry on each semiconductor die to facilitate testing thereof.

There are two types of functional tests that are utilized in computer systems. The first is "implicit" or concurrent testing or "checking". This test refers to on-line testing to detect errors that occur during normal system operation. The second is "explicit" testing. Explicit testing is carried out while the tested circuit (die) is not in use. Explicit testing includes the tests performed on dice while still on a wafer, production tests on packaged dice on boards, acceptance tests, maintenance tests, and repair tests.

In order to make testing of a resulting product economical, the semiconductor die must have a "design for testability (DFT)". DFT is utilized to increase the observability or controllability of a circuit design on a semiconductor die. The most direct way to do this is to introduce test points, i.e., additional circuit inputs and outputs to be utilized during testing. There is a cost, however, associated with adding test points. This cost may be justified, but the cost of test points soon becomes prohibitive because of the limited number of integrated circuit package pins available.

DFT requires additional logic and extra connections to the die, and it is desirable to limit these additions to those absolutely necessary to assure adequate testability of the design. The integrated circuit manufacturers have utilized various methods of estimating a design's testability. A straight forward method for determining the testability of a circuit is to use an Automatic Test Pattern Generation ("ATPG") program to generate the tests and the fault coverage. The running time of the program, the number of test patterns generated, and the fault coverage then provides a measure of the testability of the circuit.

In order to permit access to internal nodes of a circuit without requiring a separate external connection for each node requiring access, additional internal logic circuitry may be utilized primarily for the testing function. Using this test logic, it is possible to introduce scan-path test methods. Scan-path design is a DFT circuit design technique that partitions the circuit, as well as increases the observability and controllability of internal circuit nodes. Scan path design is suitable for synchronous, sequential circuits.

With scan-path design, testing of the semiconductor die is simpler and yet results in effective fault testing coverage. The scan-path technique requires that a circuit under test have two modes of operation: a normal functional mode and a test mode. The change from one mode to the other is controlled by a mode-select signal and/or by a separate test clock signal.

In the test mode, the scan elements shift data along the scan chain (as in a shift register). Thus, a test pattern can be scanned (shifted) into the scan chain, filling all scan elements with data. When the circuit under test returns to its normal functional mode, a system clock causes the test pattern to be stored in the system flip-flops and applied at the primary circuit inputs to be processed by the combinational logic part of the circuitry.

The results of the processing are stored back to the system flip-flops by the single system clock pulse. When the circuit is next placed into test mode, the resulting pattern, stored in the shift register, is then shifted out for comparison with the expected response. The ATPG program models of the scan flip-flops and latches aid the semiconductor die test designer in creating and verifying the resulting test patterns shifted out with the expected response generated from the ATPG program. A more detailed introduction to scan-path design techniques is given in *Logic Design Principles,* by Edward J. McCluskey, Prentice-Hall, 1986, and is incorporated by reference herein for all purposes.

Another important test is delay fault. The delay fault test uses the scan test to test for high speed faults. It is important in high speed semiconductor devices that not only do the circuits therein properly perform the required logic functions, but also that these circuits perform these logic functions correctly at the required speed. The combination of these tests may be called delayed ATPG.

A typical delayed ATPG test has four cycles in sequence as follows: a) scan in/out, b) strobe output, c) stabilize, and d) input. The scan in/out cycle is where data is scanned into and out of the scan chain of the semiconductor devices under test. The strobe output cycle is where the test data is strobed out of the scan chain in preparation for testing of the devices. The stabilize cycle is where the strobed data stabilizes in the semiconductor device circuits so as to avoid race conditions and internal bus conflicts before the input cycle. The input or capture cycle is where the strobed and stabilized data is transferred through the semiconductor device circuit logic by a system clock pulse at the desired operating speed of the logic devices.

After the input cycle, the next scan in/out cycle begins. The previous test results are shifted out while a new test pattern is shifted in. A comparison of the test results is made against an expected pattern and if there is a match, then the device has passed this part of the test. In the scan in/out cycle, data may be shifted into and out of the semiconductor device under test at a relatively slow speed such as, for example, 10 MHz. 10 MHz is high enough in frequency to allow shifting of the data test patterns into and out of the circuit devices without undue delay, but not so fast as to prevent standard digital logic test circuits from easily handling the data transfers. A more detailed description of this test methodology is detailed in *Chip-Level Full Scan Design Methodology Guide,* LSI Logic Corporation, January 1992, and incorporated herein by reference for all purposes.

Circuit devices of present technology semiconductor integrated circuit dice may operate at upwards of 200 MHz, and the promise of even faster devices is not too far in the future. 200 MHz devices must be tested in some fashion at their intended operating speed for the test to be meaningful. Therefore, at 200 MHZ operating speed, the input cycle must use a system clock having a 5 nanoseconds pulse width. The 5 nanosecond clock pulse causes the test pattern already scanned into the devices under test to propagate therethrough. The data pattern propagates through the test device logic and is held in the output scan register until the next scan in/out cycle. During the next scan in/out cycle, this pattern will be shifted out and compared to verify proper circuit operation.

A single system clock pulse, however, only "bangs" the previously setup data through the test device logic circuits, and the result of whatever propagates through is shifted out during the next scan in/out cycle. The aforementioned test only checks combinational logic function and does not test if the logical operations propagate through the logic being tested within a desired time period. Thus, logic operation may be correct but the time in which the logic circuits under test perform the logic operation is still unverified.

Attempts have been made to verify correct propagation time of logic devices by correlation. Correlation is when at least one path of a semiconductor device is clocked at operating speed, and correct operation of this path is verified. Thus, the device is correlated to function at a desired test speed.

What is needed is a method and apparatus which tests semiconductor devices at their operating speed. It is, therefore, an object of the present invention to test semiconductor devices at a desired operating speed with standard integrated circuit testers.

SUMMARY OF THE INVENTION

The present invention provides a method and apparatus for testing semiconductor devices at their maximum operating speed with readily available integrated circuit test equipment. The present invention accomplishes this by utilizing test circuit devices deposed on the semiconductor die. The present invention consists of integrated scan-path logic circuits, a phase-lock-loop buffered local clock, and multiplexing clock control logic with clock burst control.

In an embodiment of the present invention, a semiconductor die such as, for example, an application specific integrated circuit ("ASIC") or a microprocessor integrated circuit ("CPU") is designed utilizing DFT logic circuits adapted for scan-path delayed ATPG testing. The semiconductor die is adapted for connection to a standard logic testing system utilizing, for example, a 10 MHz test clock ("TCK"). The semiconductor device has a test data input connection, a test data output connection, a TCK input connection, and a test/normal control connection. These connections may be, for example, die connection pads or pins of an integrated circuit package.

The phase-lock-loop of the semiconductor die runs at the frequency of the system clock. On-chip phase-lock-loop circuits are typical in high speed integrated circuits for reducing clock insertion delay in the distribution of the system clock and for synchronizing all clock signals throughout the die. The phase-lock-loop of the present invention is synchronized or "phase locked" to the test system TCK frequency. As an example, a phase-lock-loop system clock may operate at 200 MHz and would be phase locked to the 10 MHz TCK frequency. The synchronized system clock and TCK frequencies are connected to the clock control logic with clock burst control.

During the scan in/out cycle, the test system loads new test pattern data into the data input connection and receives the previous test data results from the data output connection of the semiconductor die under test. The input/output test data transfers at the 10 MHz rate by the TCK signal. The test/normal control is in the test state during the scan in/out cycle.

The test pattern data is next strobed out of the DFT shift register and into the semiconductor device input logic circuits during the strobe output cycle. The test pattern data is allowed to stabilize during the stabilization cycle, and to settle and be stable for the next cycle, the input cycle. Each cycle time period may be about 1000 nanoseconds.

During the input cycle, the high speed phase-lock-loop system clock is utilized to exercise the semiconductor die device logic. The burst control logic of the clock control circuit guarantees that no more than two high speed system clock pulses occur during the input cycle. These two clocks insure that any transition propagating through the device under test must occur within a certain amount of time. In this way, the device logic under test is verified for both correct logic operation and correct logic operation occurring within a desired time, i.e., the logic is functioning at speed.

In one aspect of the invention, the phase-lock-loop system clock, clock control and burst control logic are synchronized with the TCK signal from the test system. In this way, the TCK controls all cycle functions synchronously so that only two system clocks are applied to the device logic circuits during the input cycle. Even though the phase-lock-loop is running continuously, the test/normal control signal and TCK control all test functions without glitches or other undesired clock pulses.

An advantage of the present invention is that commonly available and inexpensive test systems may be utilized with ever increasing speed semiconductor devices.

Another advantage is that the semiconductor device logic is tested for correct logic transition within a certain amount of time without requiring a high speed test system.

Still another advantage is that the present invention utilizes substantially standard scan-path registers, phase-lock-loop clock and easily implemented logic circuits to control the test cycle clocks.

A feature of the present invention is utilizing two high speed clock pulses that are synchronized with the test system clock so that precise and repeatable control of the logic test occurs.

Another feature is testing semiconductor device logic for proper test pattern propagation during a desired time period.

Yet another feature is using delayed ATPG with an inexpensive testing system and a high speed semiconductor die.

Other and further objects, features and advantages will be apparent from the following description of presently preferred embodiments of the invention, given for the purpose of disclosure and taken in conjunction with the accompanying drawings.

DESCRIPTION OF A PREFERRED EMBODIMENT

Figure 1:
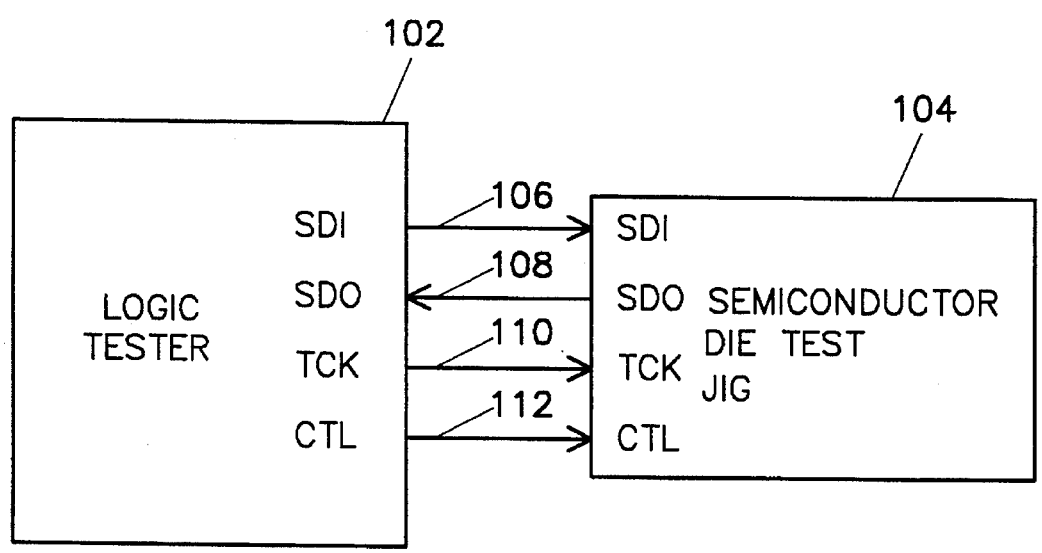
FIG. 1 is a block diagram of a test system for an embodiment of the present invention.

Referring now to the drawings, the details of a preferred embodiment are schematically illustrated. Like elements are numbered the same, and similar elements are represented by the same number and a different lower case letter suffix.

Referring now to FIG. 1, a block diagram of a test system for an embodiment of the present invention is illustrated. A standard digital logic tester 102 is connected to a semiconductor die test jig 104. The semiconductor die jig 104 is adapted to hold and probe a semiconductor integrated circuit die or dice. The dice may still be in the form of a silicon wafer, separate dice, or a die encapsulated in an integrated circuit package. The logic tester 102 may be any general purpose tester as is widely used in the semiconductor industry and well know to those skilled in the art of testing semiconductor devices.

Test signals connect between the logic tester 102 and the semiconductor die test jig 104. These signals are scan data input ("SDI") 106, scan data output ("SDO") 108, test clock ("TCK") 110, and test/normal control ("CTL").

Figure 2:
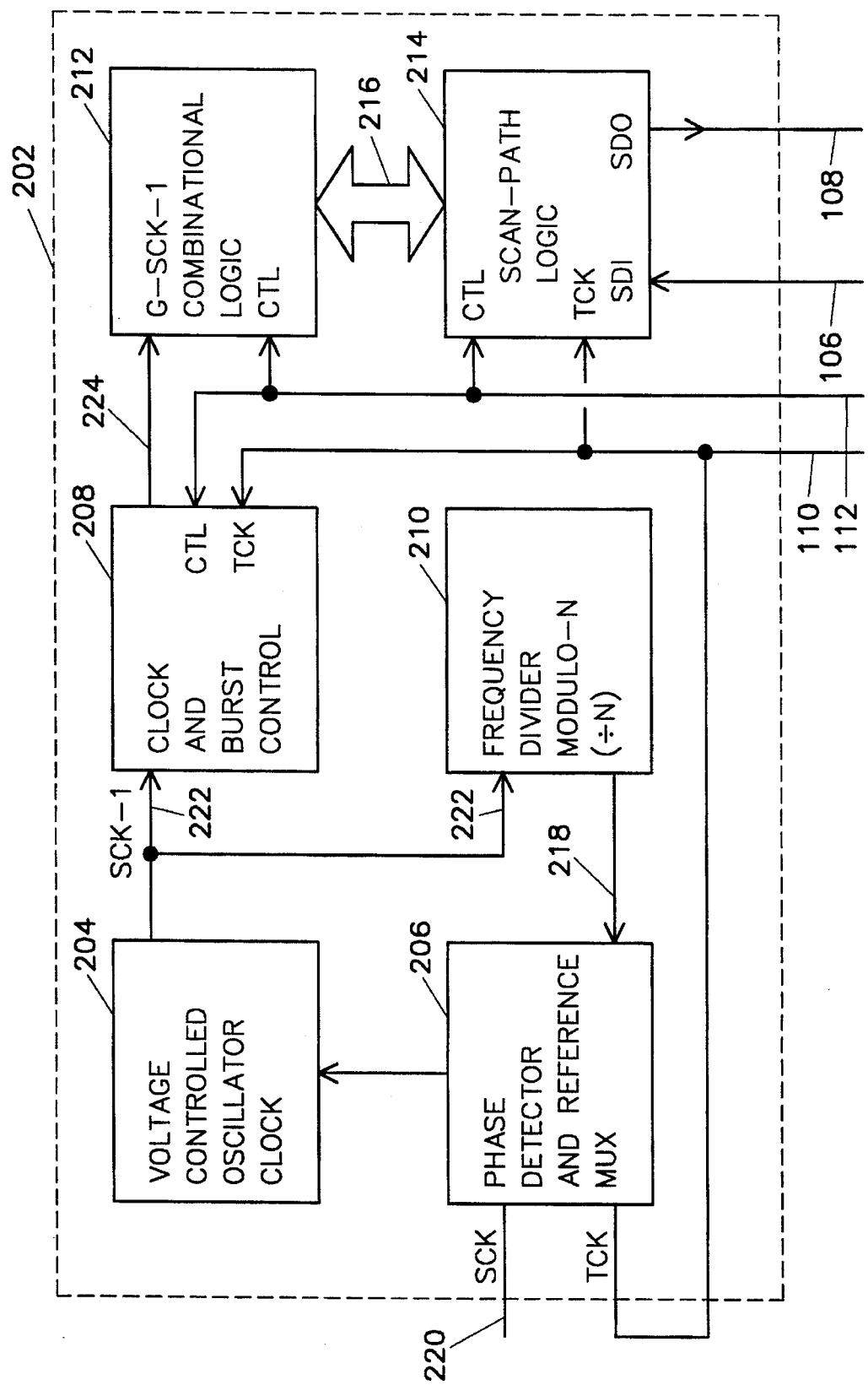
FIG. 2 is a block diagram of an embodiment of the present invention.

Referring now to FIG. 2, a schematic block diagram of a preferred embodiment of the present invention is illustrated. The present invention is a method and apparatus for testing a semiconductor die and is generally referenced by number 202. Semiconductor die 202 consists of combinational logic 212, scan-path logic 214, voltage controlled oscillator clock 204, phase detector and reference multiplexer 206, frequency divider 210, and clock and burst controller 208. The combinational logic 212 is the device logic of the semiconductor die 202 to be tested. The scan-path logic 214 is logic added to the semiconductor die 202 to enable scan-path delayed ATPG testing of the combinational logic 212.

The voltage controlled oscillator clock 204 is typically part of an on chip phase-lock-loop driven by a system clock 220 and operating at a designated frequency. The output of the voltage controlled oscillator clock 204 is clock output 222, which is used to drive clock nodes of the semiconductor die 202 and is utilized during normal operation to reduce clock insertion delay and to synchronize all clock signals on the semiconductor die 202.

The frequency of the voltage controlled oscillator clock 204 is controlled by phase detector and reference multiplexer 206. During normal operation, the phase detector and reference multiplexer 206 locks the frequency of the voltage controlled oscillator clock 204 to either the system clock 220 frequency or some multiple thereof. A modulo-N frequency divider 210 divides the clock output 222 frequency. Divided frequency output 218 is connected to the phase detector and reference multiplexer 206 and is used as the error reference. The modulo-N frequency divider 210 may have a divide ratio N of any positive integer number, and may be programmed for different values of N. Operation of phase-lock-loops are well known to those skilled in the art of communications and digital circuit design.

The phase detector and reference multiplexer 206 is also utilized to select a different reference oscillator during the test mode controlled by CTL 112. The test mode reference oscillator is TCK 110 from the logic tester 102. In the test mode, voltage controlled oscillator clock 204 is phase-locked to the frequency of TCK 110. This allows synchronous glitch free operation during the scan-path test cycles because every event during a cycle, and each cycle change, occurs on a positive edge of the TCK 110. Setup and settling transitions do not create false signals nor glitches because they occur during the time TCK 110 is at a low logic level. Thus, all logic control during the test mode is dependant on and in time sync with the logic levels of TCK 110.

The clock output 222 is connected to the input of clock and burst controller 208. The burst controller 208 is utilized to gate off and control the number of clock pulses to the combinational logic 212 during testing thereof. During normal operation, burst controller 208 allows output clock 222 to pass through to controlled clock output 224. Thus, the burst controller 208 does not interfere with normal operation of the semiconductor die 202. The burst controller 208, however, is utilized during scan-path testing for a specific purpose in the presently disclosed invention.

During scan-path testing, the scan-path logic is utilized to shift test pattern scan data into shift registers through SDI 106. After completion of shifting the scan-path data into the registers (not illustrated), the scan-path data is parallel loaded over bus 216 into the combinational logic 212 to be tested. While the scan-path data for a pending test is being shifted into registers of scan-path logic 214, the resulting test pattern scan data from the previous test run is being shifted out of the registers through SDO 108 and to the logic tester 102 for analysis thereof. Test data is obtained from the operation of the combinational logic 212 over the bidirectional bus 216.

The CTL 112 controls whether the semiconductor die logic circuits are in a normal operational mode or in a test mode. During inputting of scan-path data through the SDI 106, and outputting of resulting logic operation test data through the SDO 108, the CTL 112 has the semiconductor die 202 in test mode. During the test mode, the phase detector 206 uses the TCK 110 as the reference frequency and locks the frequency of the voltage controlled oscillator clock 204 thereto. The TCK 110 is normally at a lower frequency than the frequency of the voltage controlled oscillator clock 204.

As an example, the voltage controlled oscillator clock 204 may operate at a frequency of 200 MHz and TCK 110 may operate at a frequency of 10 MHz. The frequency divider 210 will therefore divide by N, where N=200/10 or 20. The purpose of the phase-lock-loop formed by the voltage controlled oscillator clock 204, frequency divider 210 and phase detector and reference multiplexer 206 is to synchronize the frequency and phase of the internal clock output 222 to the frequency and phase of TCK 110. The clock output 222 connects to the input of burst controller 208.

The burst controller 208 consists of logic that synchronously controls the number of pulses of controlled clock output 224 allowed to pass therethrough during the test mode. During the test mode, and after scan-path data has settled and is available for testing the logic circuits of combinational logic 212, the burst controller 208 allows only two clock pulses from controlled clock output 224 to be applied to combinational logic 212. The purpose of the two pulses is as follows: the first pulse clocks the scan-path test data into the combinational logic 212, and the second pulse signals the end of the time in which combinational logic 212 may correctly operate on this test data. If the signal has not settled by the second clock pulse then the combinational logic 212 cannot perform at speed.

By using two clock pulses at the operating frequency, such as in the above example of 200 MHz, a more deterministic test of actual device operation is obtained. Previously, scan-path testing utilized only one clock pulse which only tested the combinational operation of the combinational logic 212 without a quantitative analysis of the time in which the logic took to operate on the scan-path test data. The method and apparatus of the present invention, therefore, adds a new, novel and non-obvious quantitative time dimension to the testing of semiconductor devices with standard low speed logic testers.

Figure 3:
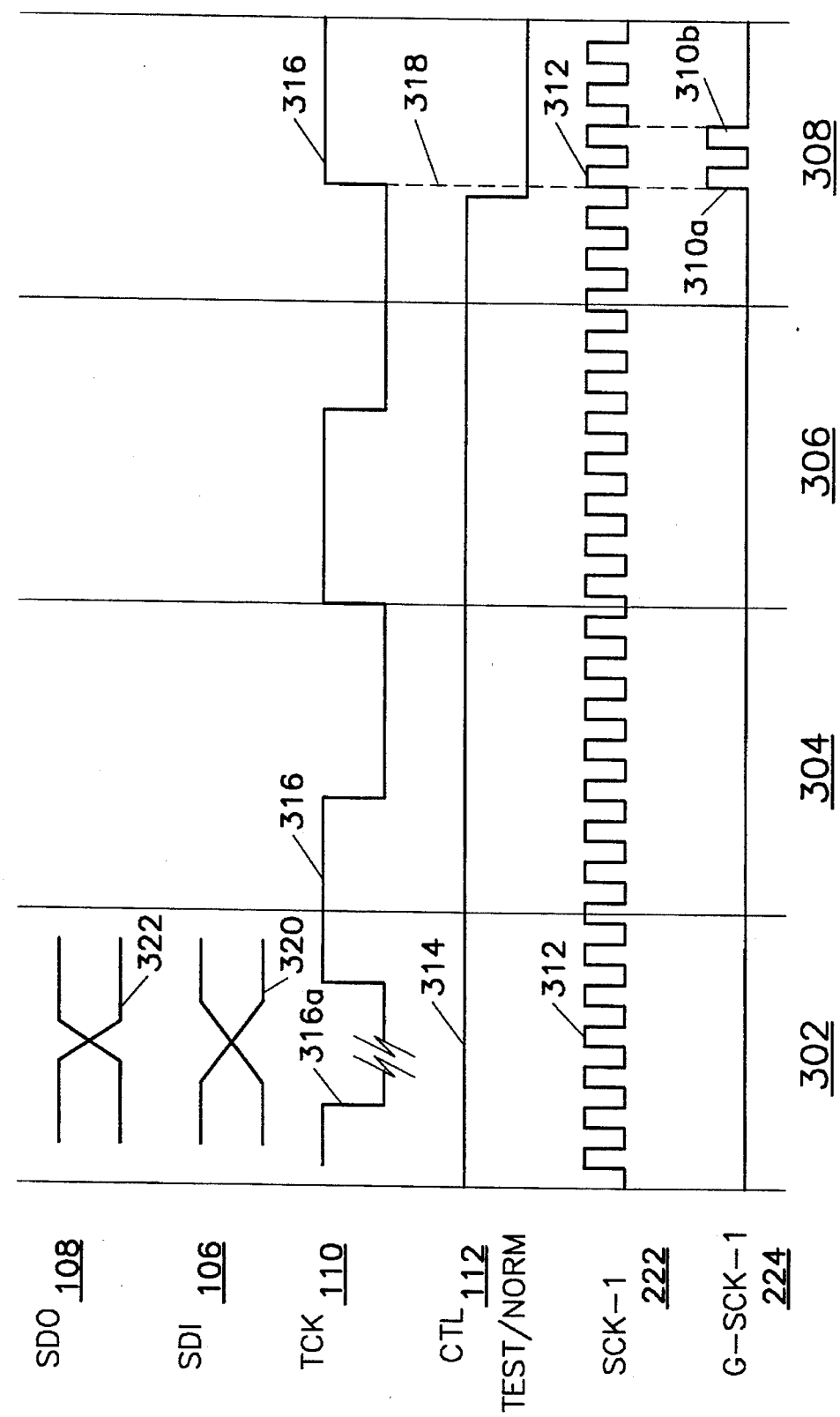
FIG. 3 is a scan-path test timing diagram of the present invention.

Referring now to FIG. 3, a scan-path test timing diagram of the present invention is illustrated. A delayed ATPG test utilizing the present invention may consist of four test cycles: scan in/out cycle 302, strobe output cycle 304, stabilize cycle 306, and input cycle 308. During the scan in/out cycle 302, scan-path data to be used in the next test is scanned into the scan-path logic 214 as SDI 106 data values 320. While the data values 320 of SDI 106 are shifting into the scan-path shift registers of the scan-path logic 214, scan-path data resulting from the previous test of the combinational logic 212 is shifted out of the scan-path registers as output data values 322 of SDO 108. The output data values 322 are compared in the logic tester 102 with an expected test pattern, and if there is correlation therebetween, the combinational logic 212 is assumed to be functioning correctly.

During scan in/out cycle 302, the scan-path data for testing the combinational logic 212 is shifted into the scan-path registers of scan-path logic 214. After scan in/out cycle 302 has completed shifting the scan-path data into the registers, the scan-path data is strobed out of the registers into the combinational logic 212 by the TCK 110 during the strobe output cycle 304. The scan-path data settles in the input part of the combinational logic 212 during the stabilize cycle 306, in preparation for testing of the combinational logic 212 during the input cycle 308.

After the scan-path data settles in the stabilize cycle 306 the input cycle 308 begins. During input cycle 308, the coincidence of CTL 112 a logic low, and leading edge clock pulses 316 and 312 at time 318 begins the scan-path data test of the combinational logic 212. Nothing happens when the clock pulse 316 is at a logic low so that the logic in the clock and burst controller 208 may be set for the pending clock pulses 310a and 310b. Clock pulses 312 of SCK-1 222 are at a higher frequency (faster speed) than the TCK 110 clock pulses 316. The clock pulses 312 and 316 are phase locked in frequency and phase, therefore each clock pulse leading edge, when going from a logic low to a logic high, will occur at substantially the same time as is indicated by the number 318.

CTL 112 signal 314 indicates to the burst controller 208 that input cycle 308 is in progress. When TCK 110 goes from a logic low to a logic high, during input cycle 308, the burst controller 208 allows only two clock pulses 310a and 310b to pass therethrough. The clock pulses 310a and 310b are derived from the clock pulses 312 of SCK-1 222. The clock pulses 310a and 310b are applied as G-SCK-1 224 to the combinational logic 212 at time 318. The first clock pulse 310a causes the combinational logic 212 to start processing the scan-path data, and the second clock pulse 310b to stop the data processing.

In this way, the present invention tests for proper operation of the combinational logic 212 during a time period determined by the time between clock pulses 310a and 310b. Thus, the combinational logic 212 may be tested at its normal operating speed with a standard low speed logic tester 102. One skilled in the art of testing semiconductor device will readily appreciate that two or more clock pulses 310 may be utilized to test semiconductor devices at speed, and that the test cycles 304 and 306 may be combined, or additional test cycles added during testing of the combinational logic 212. Various high speed logic tests may be performed on the combinational logic 212 by appropriately designed test scan-path logic 214 in combination with control, and phase locked test and system clock signals. The present invention quantitatively performs high speed tests on combinational logic 212 with a standard low speed logic tester 102 that includes testing of both the logic functions and the time in which these functions are performed.

The present invention, therefore, is well adapted to carry out the objects and attain the ends and advantages mentioned, as well as others inherent therein. While a presently preferred embodiment of the invention and various aspects thereto has been given for purposes of disclosure, numerous changes in the details of construction, interconnection and arrangement of parts will readily suggest themselves to those skilled in the art and which are encompassed within the spirit of the invention and the scope of the appended claims.

What is claimed is:

1. A method for testing semiconductor devices at operating speed, comprising the steps of:

loading test data from a logic tester into a test data storage register;

loading the test data from the test data storage register into inputs of the semiconductor device combinational logic operating circuits;

synchronizing a semiconductor device clock with a test clock of the logic tester starting operation of the semiconductor device combinational logic operating circuits on the test data with a first clock pulse, wherein the first clock pulse is generated from the semiconductor device clock by clock control logic;

stopping operation of the semiconductor device combinational logic operating circuits on the test data with a second clock pulse, wherein the second clock pulse is generated from the semiconductor device clock by the clock control logic, wherein the time between the first and second clock pulses is the time in which the semiconductor device combinational logic operating circuits operate; and unloading output data generated from the operation of the semiconductor device combinational logic operating circuits on the test data.

2. A method for testing semiconductor device combinational logic operating circuits at operating speed, comprising the steps of:

loading test data from a logic tester into a test data storage register while unloading from the test data storage register the resulting test data from a prior test to the logic tester at the logic tester test clock rate during a scan input/output cycle;

loading the test data from the test data storage register into inputs of the semiconductor device combinational logic operating circuits during a strobe output cycle;

stabilizing the states of the loaded test data at the in_puts of the semiconductor device combinational logic operating circuits during a stabilize cycle;

synchronizing the frequency and phase of a phase-lock-loop oscillator with the frequency and phase of the test clock of the logic tester;

starting operation of the semiconductor device combinational logic operating circuits on the test data with a first clock pulse, wherein the first clock pulse is generated from the phase-lock-loop oscillator by clock control logic during an input cycle;

stopping operation of the semiconductor device combinational logic operating circuits on the test data with a second clock pulse, wherein the second clock pulse is generated from the phase-lock-loop oscillator by the clock control logic during the input cycle, wherein the time between the first and second clock pulses is the time in which the semiconductor device combinational logic operating circuits operate; and storing in the test data storage register the resulting data generated from the operation of the semiconductor device combinational logic operating circuits on the test data loaded during the strobe output cycle.

3. A system for testing semiconductor devices at operating speed, said system comprising:

a logic tester having a test data output, a test data input, a control output and a test clock;

a semiconductor device comprising;
  semiconductor device combinational logic operating circuits;
  a phase-lock-loop oscillator having a reference input and a clock output;
  a clock control circuit connected between the clock output of the phase-lock-loop oscillator and the semiconductor device Combinational logic operating circuits; and
  test data storage circuits, the test data storage circuits connected to the semiconductor device combinational logic operating circuits;

the phase-lock-loop reference input connected to the test clock of the logic tester;

the phase-lock-loop being synchronized in frequency and phase to the logic tester test clock frequency;

the test data storage circuits connected to the logic tester test data output and input, and receiving and transmitting test data therebetween, respectively; and the clock control circuit controlling the phase-lock-loop clock output so that first and second clock pulses thereof control operation of the semiconductor device combinational logic operating circuits;

wherein the first clock pulse starts operation of the semiconductor device combinational logic operating circuits on the test data and the second clock pulse stops operation of the semiconductor device combinational logic operating circuits on the test data and the resulting data from operation thereof is stored in the test data storage logic.

4. A semiconductor device having testing circuits for testing said semiconductor device combinational logic operating circuits at operating speed, said semiconductor device comprising:

a phase-lock-loop oscillator having a reference input and a clock output;

a clock control circuit connected between the clock output of said phase-lock-loop oscillator and the semiconductor device combinational logic operating circuits;

test data storage circuits, said test data storage circuits connected to the semiconductor device combinational logic operating circuits;

said phase-lock-loop oscillator reference input having a connection for connecting to a logic tester test clock;

said phase-lock-loop oscillator having the capability of being synchronized in frequency and phase to the logic tester test clock frequency;

said test data storage circuits having connections for connecting to the logic tester and being capable of receiving and transmitting test data therebetween; and said clock control circuit receiving the phase-lock-loop oscillator clock output and creating first and second clock pulses therefrom so as to control operation of the semiconductor device combinational logic operating circuits at speed;

wherein the first clock pulse starts operation of the semiconductor device combinational logic operating circuits on the test data and the second clock pulse stops operation of the semiconductor device combinational logic operating circuits on the test data.

5. The semiconductor device of claim 4, wherein said phase-lock-loop oscillator comprises:

a voltage controlled oscillator, said voltage controlled oscillator frequency controlled by a control voltage;

a phase detector having an output which produces the control voltage which controls said voltage controlled oscillator frequency;

a frequency divider for dividing the frequency of said voltage controlled oscillator to a lower frequency;

a reference frequency multiplexer for selecting a reference frequency for said phase detector;

said phase detector comparing the divided frequency from said frequency divider with the selected reference frequency and producing the control voltage for controlling the frequency of said voltage controlled oscillator so that the two frequencies are in frequency and phase-lock together; and said reference frequency multiplexer selecting the logic tester test clock as the reference frequency when in a test mode.

6. The semiconductor device of claim 4, wherein said clock control logic passes two consecutive phase-lock-loop oscillator clock pulses during an input test cycle.

7. The semiconductor device of claim 4, wherein said test data storage circuits comprise a plurality of shift registers having serial input and output ports and a parallel output bus connected to the semiconductor device combinational logic operating circuits for loading test data thereto.

8. The semiconductor device of claim 7, wherein said test data storage circuits are loaded with test data from the logic tester during a scan cycle.

9. The semiconductor device of claim 8, further comprising said test data storage circuits unloading test data from a prior input test cycle to the logic tester during the scan cycle.

10. The semiconductor device of claim 9, wherein a scan input/output cycle loads data to said test data storage circuits and unloads data, from a prior input cycle test, from said test data storage circuits, a stabilization cycle allows the loaded data to stabilize to the semiconductor device combinational logic operating circuits and an input cycle tests the semiconductor device combinational logic operating circuits at operating speed.

* * * * *